United States Patent [19]

Brittan

[11] 4,048,484
[45] Sept. 13, 1977

[54] DIGITAL GRADE AVERAGER

[76] Inventor: John L. Brittan, 1113 Brunn Ave., St. Joseph, Mich. 49085

[21] Appl. No.: 680,223

[22] Filed: Apr. 26, 1976

[51] Int. Cl.$^2$ .................. G06F 15/02; G06F 15/20
[52] U.S. Cl. .................................................. 235/156
[58] Field of Search ............... 235/152, 156, 164, 168

[56] References Cited
U.S. PATENT DOCUMENTS

| | | | |
|---|---|---|---|
| 3,470,368 | 9/1969 | Brittan | 235/193 |
| 3,924,111 | 12/1975 | Farris | 235/156 |
| 3,947,669 | 3/1976 | Simmons et al. | 235/156 |
| 3,955,074 | 5/1976 | Rode et al. | 235/156 |
| 3,973,113 | 8/1976 | Goldsamt | 235/156 |
| 3,979,058 | 9/1976 | Katz et al. | 235/156 |

*Primary Examiner*—Jerry Smith

*Attorney, Agent, or Firm*—Price, Heneveld, Huizenga & Cooper

[57] ABSTRACT

A digital calculator particularly adapted for utilization by teachers in averaging a plurality of grades. The device employs a key board with letters, indicative of letter grades as used in the teaching profession, A+, A, A−, B+, etc. to E, and numbers 0 to 13, a regular calculator chip, circuitry for generating the numbers 10, 11, 12, and 13 and circuitry for decoding the letter grade from the digital output when letter grades are entered and after the grades are averaged. A counter is provided to keep track of the grades entered. All of the calculator chip features are retained at the key board so that the device can be operated as a regular calculator for arithmetic computations as well as averaging grades.

16 Claims, 12 Drawing Figures

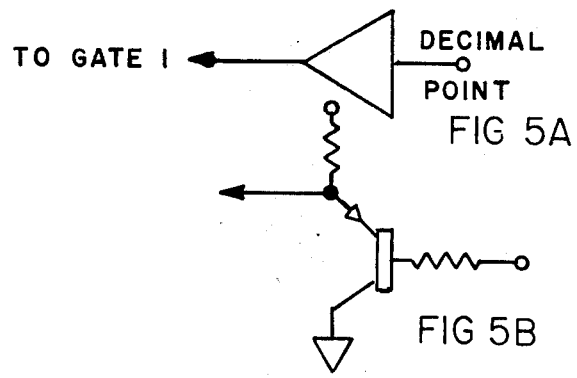
FIG 5A
FIG 5B
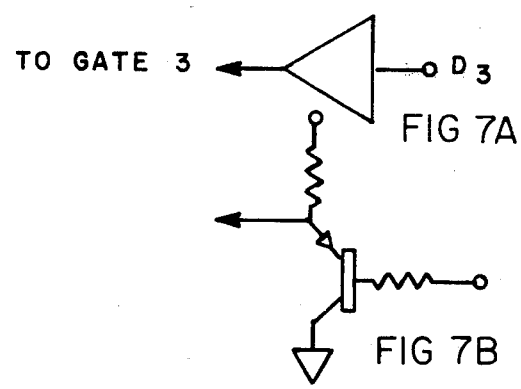
FIG 7A
FIG 7B
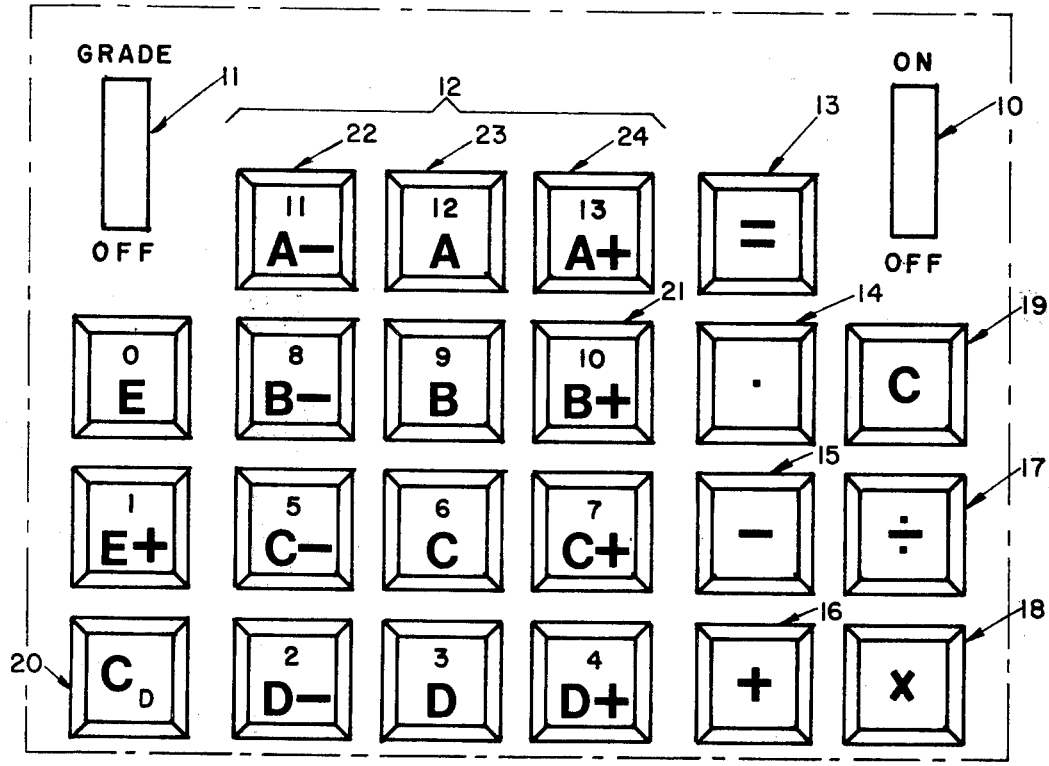
FIG. 1

DIGITAL GRADE AVERAGER

BACKGROUND OF THE INVENTION

The invention relates to the art of digital calculators and, more particularly, such a calculator specifically adapted to perform the task to averaging letter grades earned by students in each course during a particular school term to determine the final grade to which the student is entitled. It is an improvement on the analog device described in this inventor's previous United States Pat. No. 3,470,368 issued Sept. 30, 1969.

During a marking period teachers generally administer various test instruments such as quizzes, tests, exams, and assignments such as term papers, reports, essays, laboratory reports, etc. that are assigned letter grades. To obtain an exact grade average the instructor must assign a numerical number to each letter grade, sum these numbers and divide the sum by the total number of letter grades to obtain the average. This must be done for each student.

The previously noted patent describes and generically claims an analog device for performing these operations. While such device has obtained a measure of commerical success, certain drawbacks are inherent from its very nature. Among these are a tendency to drift, particularly when the averaging sequence is not performed quickly, an inability to indicate the number of entries which have been made, limited accuracy to extended decimal places and no provision for "in sequence" corrections. This analog device, moreover, is limited practically to the single use of averaging grades.

OBJECTS AND SUMMARY OF THE INVENTION

It is an object of this invention to provide a grade averaging device which retains the highly desirable capabilities of the device described in the aforenoted patent and, yet, over comes many of the disadvantages inherent in that device.

It is an object of this invention, more particularly, to provide a device of the character described wherein all significant information through the course of a particular averaging sequence is readily discernible from a digital visual display.

It is an object of this invention, additionally, to provide such a device wherein multi-digit numerical weights for certain of the letter grades may be entered by activation of a single key.

It is yet another object of this invention to provide a digital grade averaging device wherein a plurality of letter grades may be entered without first having to enter, or make provision for, the total number of grades to be averaged.

It is a further object of this invention to provide a device capable of displaying the tally or total number of inputs at any time during the entering of letter grades, the last count of the tally utilized to obtain the average of all grades entered.

It is another object of this invention to provide a device capable of calculating the grade point average to four significant digits, or more, all digits being concise.

It is another object of this invention to provide a device capable of correction of a wrong grade entry without having to clear the device and start all over again.

It is an object of this invention to provide an electronically stable device of the character described wherein summed numerical quantities will not drift despite the time period involved in a particular averaging sequence.

It is also an object of the present invention to provide a device of the type described having the noted capabilities and, yet, usable additionally to perform conventional mathematical calculations.

Many of these and other objects of this invention are accomplished by a device including a keyboard having a plurality of manually operable grade keys, each key bearing as a label a particular letter grade in said particular system. Digital display means including a series of discrete digital units are provided, said display means having a letter grade display section, a numerical weight display section and a number of inputs section.

The apparatus includes means for activating said display means such that when a particular grade key is actuated the particular grade of that key is displayed on said letter grade display section, the numerical weight assigned that particular grade is displayed on said numerical weight display section and the cumulative number of grade keys which have been actuated in that particular sequence is displayed on said number of inputs section. Means are included for summing the numerical weights of all the particular grade keys which have been actuated in a particular sequence and for dividing said sum of numerical weights by said cumulative number to arrive at an average numerical weight. This average numerical weight is decoded to determine its letter grade equivalent and such equivalent displayed on the letter grade display section.

BRIEF DESCRIPTION OF DRAWINGS

FIG. 1 is a schematic representation of a key board suitable for use with this invention;

FIGS. 5A and 5B are logic and schematic diagrams, respectively, of a Gate 1 signal source suitable for use with this invention;

FIGS. 7A and 7B are logic and schematic diagrams, respectively, of a Gate 3 signal source suitable for use with this invention.

DETAILED DESCRIPTION OF THE PREFERRED EMBODIMENT

Figure 2A:
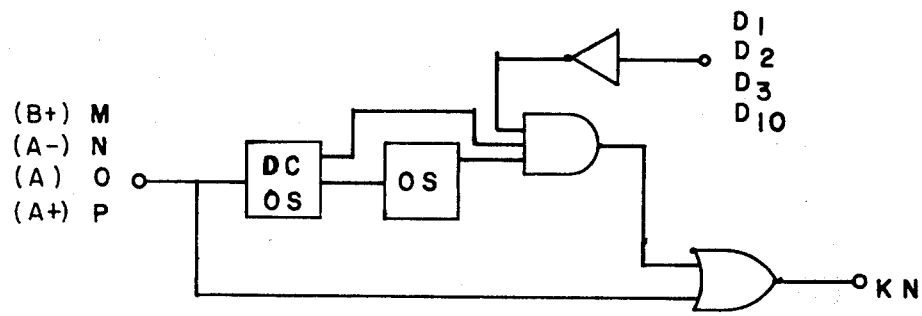
FIGS. 2A and 2B are logic and schematic diagrams, respectively, of one of the four identical circuits used to generate the double digit entry of this invention.

The grade averager which is the subject of this invention is preferably housed in a more-or-less conventional digital calculator housing including a keyboard and a display section, the latter preferably being positioned rearwardly from and at an angle with respect to the keyboard in conventional fashion. The display section 101 illustrated schematically in FIG. 3A includes a series of thirteen display elements, nine (54–58 and 150) of which are utilized for display of the grade point or actual calculator computations, two (151) of which are utilized to display the cumulative number of grades entered and two (60 and 61) of which are utilized to display the letter grade and plus or minus symbols. Each display element is of the conventional seven segment type illustrated in FIG. 3B. Element 60 has segments 1, 5 and 6 on at all times since these segments are necessary to display all of the letter grades A through E.

FIG. 1 showing the keyboard arrangement comprises an ON-OFF switch 10, grade average switch 11, to be depressed when averaging letter grades as opposed to performing general calculations, letter grade keys 12 also with numerals 0 through , 13 arithmetic equals key 13, plus key 16, divide key 17, times key 18, minus key 15, clear key 19, and clear display key 20. The particular grading system for which the preferred embodiment has been disigned is the A+ through E system. Each of these letter grades has been assigned, as illustrated on the keys 12 in FIG. 1, a numerical weight from 0 to 13 in ascending order.

All letter grade keys numered 0 to 9 (E through B) key in their respective digit signals in conventional fashion as specified by the calculator chip manufacturer. Since such calculator chips do not provide for double digit entry by one key, the B+ key 21, representing the number 10, the A-key 22 for the number 11, the A key 23 for the number 12, and the A+ key 24 for the number 13, generate the proper signals to accomplish the necessary double digit entry into the calculator chip.

Figure 2B:
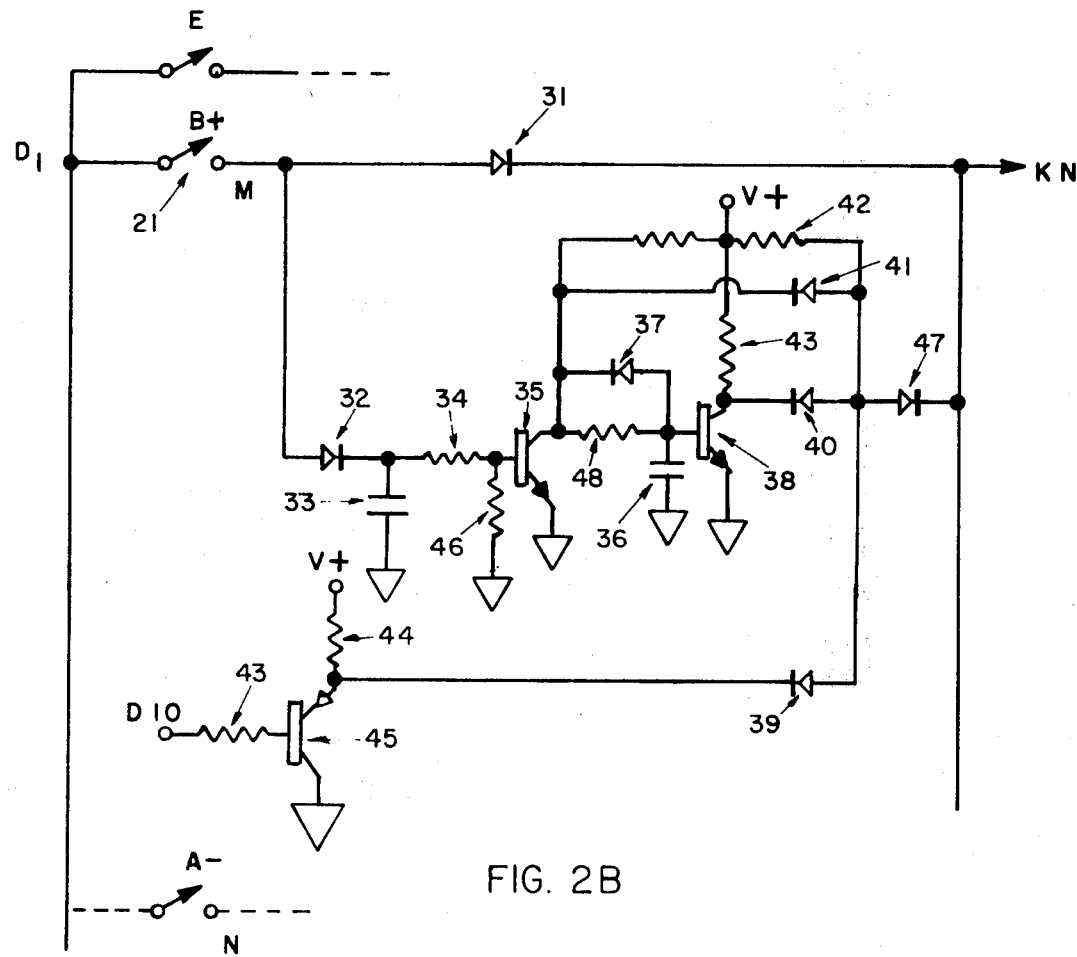

FIG. 2 illustrates one of four identical circuits used to create the appropriate double digit entry. The generation of B+ signals will be used to explain the circuit. When the B+ key 21 is depressed, multiplexed signal $D_1$ from calculator chip output, representing the numeral digit 1, enters the calculator chip input terminal KN through blocking diode 31. This causes a numeral 1 to enter the calculator chip in the same manner as pressing the 1's digit key. At the same time the $D_1$ signal also flows through diode 32 charging capacitor 33. This filtered DC bias then flows through current limiting resistor 34 and turns on transistor 35. Capacitor 36 dumps its charge through diode 37 through the collector emitter path of transistor 35 turning transistor 38 off causing, in the language of pulse electronics, a 1, by way of resistor 43, at the input of the AND gate comprised of diodes 39, 40 and 41 and resistor 42. Transistor 35, however, is placing a 0 at the input diode 41 of the above mentioned AND gate as it is at this time still in the "ON" condition. Multiplexed signal $D_{10}$ representing the zero numeral digit, passing through its amplifier composed of resistors 43 and 44 and transistor 45 awaits to pass through the AND gate at diode 39 when all three AND gate inputs are a 1.

The closing of key switch 21, then, causes the AND gate inputs at diode 41 to be a 0, diode 40 to be a 1 and diode 39 to be a multiplexed 1 signal from $D_{10}$. When key switch 21 is released, resistor 46 discharges capacitor 33 turning off transistor 35 causing a 1 at diode 41 and thus all AND gate inputs are now a 1 and the $D_{10}$ signal representing the zero numeral leaves the AND gate through the OR gate blocking diode 47 entering the calculator input terminal KN. With transistor 35 now in an off condition, capacitor 36 charges through resistor 48 turning "ON" transistor 38. This puts a 0 at AND gate input diode 40 thus shutting "OFF" the signal $D_{10}$. The calculator chip, as will be pointed out later, functions electrically to shift the keyboard entered digits to the left starting at element 54 in conventional fashion. Depression of key 21, thus, causes the 1 ($D_1$) to appear at element 54. When key 21 is released, the 1 is shifted to element 55 and the 0 is displayed in element 54.

Three more identical circuits are provided. The first uses signals $D_1$ and $D_1$ to produce the numeral 11 for A−; the second signals $D_1$ and $D_2$ to produce 12 for A; and, the third signals $D_1$ and $D_3$ to produce numeral 13 for A+. These circuits function identically to that described with the exception of the noted input and output changes.

Figure 3A:
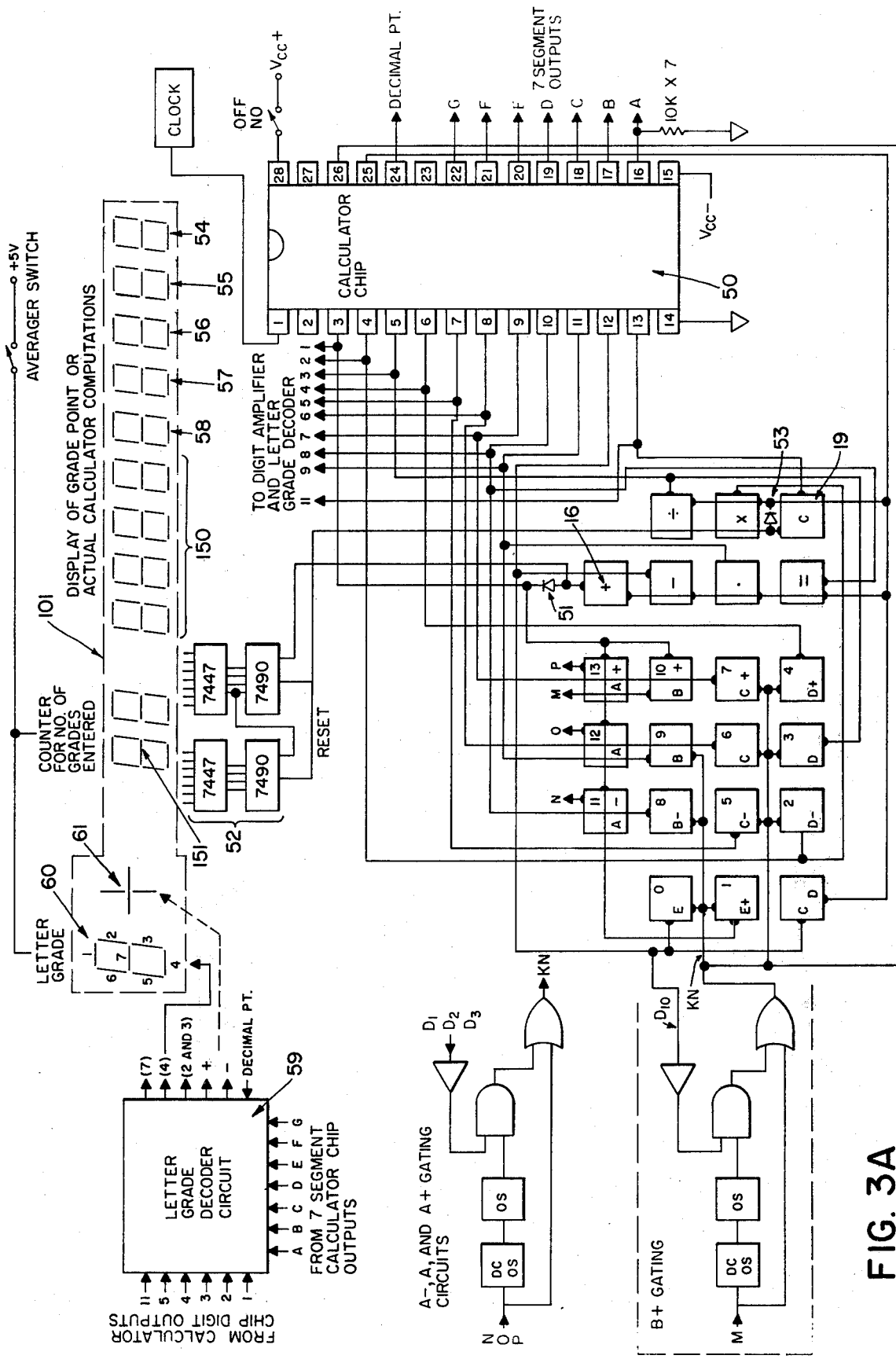
FIG. 3A is a block diagram showing the circuitry supporting the calculator chip for averaging letter grades.

FIG. 3A is the block diagram showing the arrangement of the circuitry supporting the calculator chip for the purpose of averaging letter grades. Multiplexed digit and segment output signals from calculator chip 50 are sent to the 9 seven segment display elements 54 through 58 and 150 through interfacing amplifiers as per calculator chip manufacturer's specifications. For clarity the interfacing amplifiers are omitted. As before mentioned, the key switches for digits 0 to 13 are also labeled with letters representing letter grades E to A+. As each letter grade key is depressed (and released in the case of keys 21-24) the numerical weight assigned that letter will be displayed at elements 54 and 55. As each key is released, the letter grade corresponding to the depressed key is displayed at elements 60 and 61 in the manner described hereinafter. The arithmetic plus key 16 is then depressed to enter the appropriate digit into the calculator chip memory through diode 51. As this signal leaves key switch 16 it is also sent to the two digit counter 52 to tally the number of grades entered. When it is time to enter letter grades for the next student, key switch 19 is depressed causing signal to reset counter 52 and by passing through diode 53, to clear calculator chip 50.

Only digits 54 and 55 are illuminated as letter grades are entered by the teacher since digits 0 to 13 (no more than two digits) represent letter grades E to A+. The letter grade decoder 59 must at this time be able to decode digits 54 and 55 and display the appropriate letter grade at the letter grade display 60 and +, − display 61. By the gating process to be discribed, decoder 59, using elements 56, 57 and 58, also decodes the correct letter grade at the time the four significant digit grade point average is displayed at digits 54 through 58.

Figures 3B, 4:
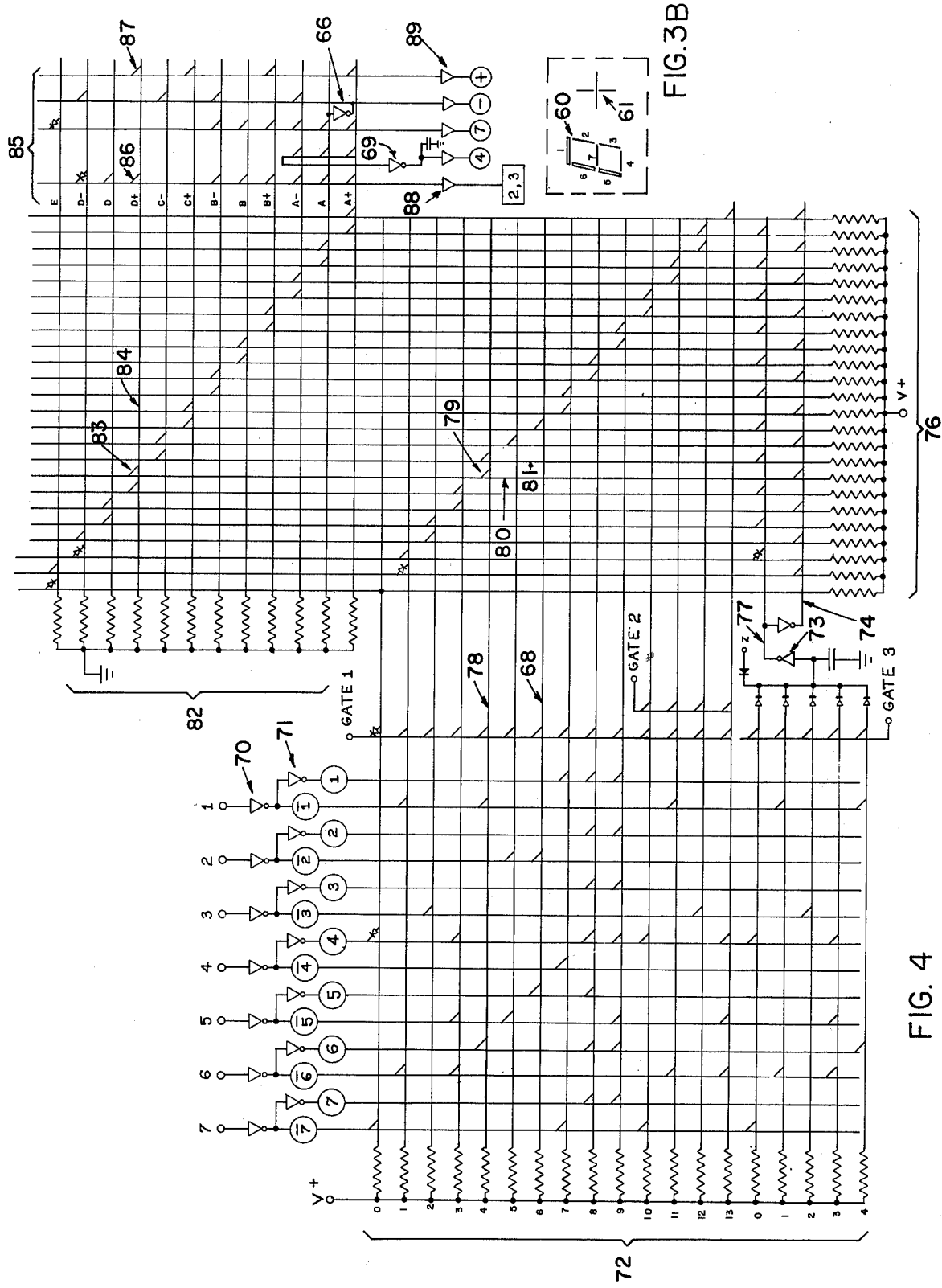
FIG. 3B is a schematic illustration of the letter grade display section of the display means.
FIG. 4 is a schematic illustration of the letter grade and plus-minus decoder circuit for the letter grade and plus-minus display.

Decoding signals at digits 54 through 58 by decoder circuit 59 is accomplished as illustrated in FIG. 4, the main decoder circuit. The multiplexed 7 segment signals from the calculator chip 50 are shown numbered from 1 to 7. Inverter amplifiers 70 generate the NOT signals as well as given isolation from the calculator chip. Inverter amplifiers 71 restore the original signals. A total of 7 calculator chip 50 signals and 7 NOT signals, then, are present and used in conjunction with AND gate 72 and gates 1 and 2, when decoding digits 54 and 55 and gates 1, 2 and 3 when decoding digits 56, 57 and 58.

Gate 1 derives its signal from the decimal point signal as shown in FIG. 5. As stated above, entering letter grades causes only digits 54 and 55 to be activated. Since only whole numbers are entered, the decimal point is at digit 54 and is therefore, synchronized with digit 54 during the multiplexing cycle. The multiplexed seven segment signals will only pass through AND gate 72 when gate 1 is a 1 and this allows digit 54 signals to decode digits 0 to 9 as defined by the diodes and resistors associated with AND gate 72.

Figures 6A, 6B:
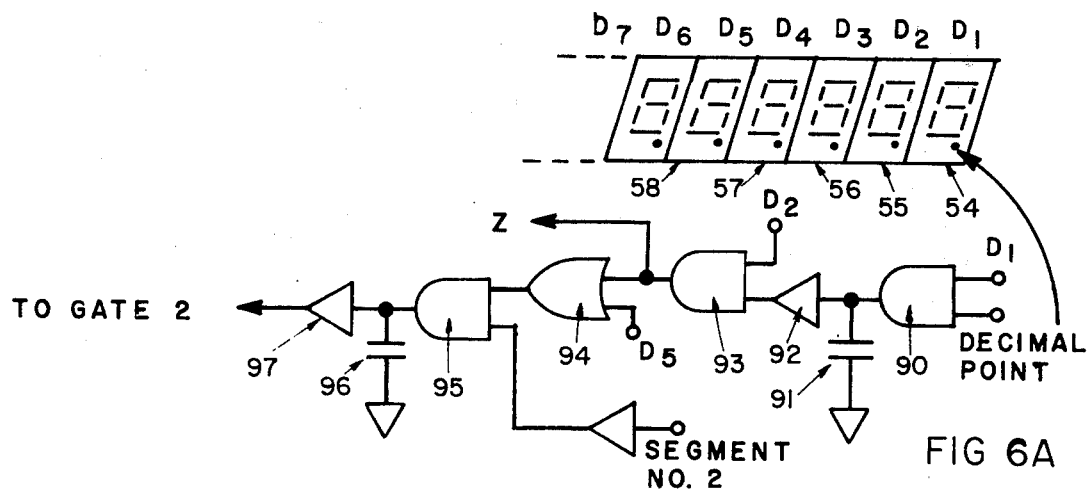
FIGS. 6A and 6B are logic and schematic diagrams, respectively, of a Gate 2 signal source suitable for use with this invention.

Gate 2 provides a 1 at the time when digit 55 indicates a numeral 1 for the 10, 11, 12 and 13 numerals representing B+, A−, A and A+. In FIG. 6, the proper gate 2 signal, for a 1 numeral at digit 55 when entering letter grades, is generated by having digit 54 $D_1$ signal and the decimal point signal enter AND gate 90, and be changed from a multiplexed signal to a DC signal by capacitor 91 and amplifier 92 to give time for the multiplexed digit 55 $D_2$ signal to enter AND gate 93. A 1 at the output of AND gate 93 is simply saying that the decimal point is now at digit 54 and that digit 55 $D_2$ segments can now be detected if one or more segment signals is sampled. A 1 at digit 55 causes segment 2 and 3 to come ON. Only segment 2 or 3, then, is needed to indicate the presence of a numeral 1 at digit 55. The 1 at the output of AND gate 93 is passed through the OR gate 94 and this signal with segment No. 2 signal passes through AND gate 95, changed to a DC 1 by capacitor 96 and amplifier 97 and sent to gate 2 input at the decoder AND gate 72. It should be evident that when a 1 numeral is present at digit 55 and a numeral 0, 1, 2 or 3 at digit 54, the multiplexed signal at gate 1 and gate 2 DC 1 signal will decode signals indicating numerals 10, 11, 12 and 13.

Gate 3 derives its signal from digit 56 $D_3$ as indicated in FIG. 7. At this time digit contains no numerals; therefore, no multiplexed signals appear at the input to inverter amplifier 73 of FIG. 4. It is necessary that a 1 be present at the input to amplifier 73 to create the effect that all digits entered via keyboard are between 0 to 0.4 in order for AND gate 76 to correctly decode the numerals representing letters. For example, the decoder must decode a 5 as a C−. It is also true that 5.1 or 5.2, 5.3 and 5.4 are also a C−. When the decoder is called upon to decode the averaged grade point average, of say, 5.324, it must be able to decode this as a C−. However, if the grade point average is 5.500, the decoder must now show a C letter grade for the range of C is between 5.500 to 6.499. By producing a phantom signal, called Z, to cause AND gate 76 into a mode of 0 to 0.4 as a 1, it will correctly decode all letter grades entered at display digits 54 and 55. The proper Z signal is that leaving AND gate 93 of FIG. 6. This signal as previously described detects the presence of keyboard numerals at digits 54 and 55.

Now, assume that a letter grade D+ is entered causing a numeral 4 at digit 54. This is sensed by segment 1 not being energized (NOT 1) and segment 6 which is energized. Line 78 in FIG. 4 now contains a 1. Following this line to the right into the AND gate diodes 79, observe that two diodes 79 are connected to lines 80 and 81. Only AND gate 76 line 80 can have a 1 on it for gate line 74 is a 1 and gate line 77 is a 0. The 1 signal at line 80 now goes up into OR gate 82 through blocking diode 83, next to the right on line 84 and into the OR gate 85. Diode 86 turns ON amplifier 88 which lights up segments 2 and 3. Diode 87 turns ON amplifier 89 causing the + digit to come ON. Note that the inverter amplifier 69 input is at a 0 for no A signals are decoded at this time. The output of amplifier 69 is, therefore, a 1 and segment 4 is ON. All segments except 7 are ON indicating a D. Thus it has been shown that a D+ has been decoded when the numeral 4 is present at digit 54. In like manner numerals 0 to 13 can be shown to cause letter grades E to A+ to appear at the letter grade display 60 and +, − display 61.

The decoding process following the entry into the keyboard of a plurality of letter grades will now be considered. Let it be assumed that 5 letter grades of B+, B+, D−, C+, D+ have been entered via the key board. The next step is to read the counter which indicates 5 grades have been entered. Next, press the ÷ key, the key indicating numeral 5 and then the equals (=) key. The letter grade of C+ and grade point average 6.600 will appear. It will be noted that the decimal point has moved over to the left three places to digit 57. Digits 54 and 55 now contain the numerals 00 and obviously this does not represent the letter grade C+. The information for decoding C+ is contained at digits 57 and 56 (6.6). Since gate 1 at the decoder uses the decimal point signal and the decimal point has moved to the left three places, gate 1 is now sensing 7 segment signals from digit 57. Gate 2 for the numerals 10, 11, 12 and 13 has also left digit 55 and gone to digit 58 to sense if a numeral 1 is at digit 58. Observe FIG. 6 and note that AND gate 90 no longer is capable of a 1 at its output for digit 54 $D_1$ signal and the decimal point signals are no longer synchronized. If follows that the output of AND gate 93 must now be a 0 causing the phantom Z signal to cease, returning gate 3 to detect signals from digit 56 to determine if the numerals at digit 56 are >5 or <5. FIG. 7 indicates digit 56 $D_3$ signal as its signal source.

Returning to gate 2, FIG. 6, $D_5$ signal from digit 58 through OR gate 94 and AND gate 95 and segment No. 2 signal to sense if a numeral 1 is at digit 58 to detect numerals 10, 11, 12 and 13, next pass through AND gate 95 and are changed to a DC 1 by capacitor 96 and amplifier 97. In the example, however, digit 58 does not contain a numeral 1 causing segment No. 2 to be a 0. Gate 2 output is thus a 0.

The numeral 6 at digit 57 is sensed by segment NOT 2 signal and segment 5 signal which is energized. Line 68 FIG. 4, now contains a 1. Following this line through the decoder, as before, will result in a C+ output at the letter grade display.

Inverter amplifier 66 is necessary to eliminate the minus signal for the letter grade of A for seven segment signals decoding the 2 in the numeral 12 are also present at the D− 2. This also occurs at the time numerals 10, 11 and 13 (0, 1, 3 for letters E, E+ and D) appear; however, these signals, while present do not cause an incorrect letter display for the B+, A− and A+. The purpose of inverter 66, then, is to correct the A− to an A.

BRIEF DESCRIPTION OF OPERATION

The digital averager works as follows:
1. Depress OFF-ON switch to ON.
2. Depress averager switch 11 to ON position when wanting to average letter grades.
3. Press clear key at lower right of key board.
4. Averager is now ready to accept letter grades as follows:
   a. Depress proper letter grade. Confirm the accuracy of input by checking at elements 60 and 61. (When a mistake has been made, it is only necessary to press the clear display $C_D$ key and enter the correct letter grade).
   b. Next press plus (+) key 16. Each time the plus key is depressed, segments 60 and 61 go off; the aggregate numerical weight of the keys which have been pressed appears at elements 54-58 and the tally or total number of inputs appears at elements 151.
   c. Continue to enter grades by depressing the letter grade key, then the plus key 16.

d. When all grades have been entered, read the two digit counter. Press the divide (÷) key 17 and then press the proper digit key to enter the number indicated by the counter.

e. Next, press the equals (=) key 13 and note the averaged letter grade and correct grade point based on 12 points equal A.

By next dividing by 3, the grade point now is correct for 4 points equal A. However, the letter grade is no longer valid. Additional timing circuits can be provided, if desirable, to latch the letter grade and cause the grade point to continue to divide down to 4 points equal A.

The device can be used as a conventional calculator by turning averager switch 11 to the OFF position. The invention permits the use of keys 21–24 in this mode of operation if desirable.

While a preferred embodiment of this invention has been described in detail, it will be apparent to those skilled in the art that other embodiments may be conceived and fabricated without departing from the spirit and scope of this invention. Such other embodiments are to be deemed as included within the scope of the following claims unless these claims, by their specific language, expressly state otherwise.

The embodiments of the invention in which an exclusive property or privilege is claimed are defined as follows:

1. A digital calculator apparatus for use by teachers for averaging a sequence of grades in a particular letter grading system, each grade of the system having a pre-assigned numerical weight, said apparatus comprising:
    a keyboard having a plurality of manually operable grade keys, each key bearing as a label a particular letter grade in said particular system;
    digital display means including a series of discrete signal display units, said display means having a letter grade section, a numerical weight display section and a number of inputs section;
    means for activating said display means such that when a particular grade key is actuated the particular grade of that key is displayed on said letter grade display section, the numerical weight assigned that particular grade is displayed on said numerical weight display section and the cumulative number of grade keys which have been actuated in that particular sequence is displayed on said number of inputs section;
    means for summing the numerical weights of all the particular grade keys which have been actuated in a particular sequence;
    means for dividing said sum of numerical weights by said cumulative number to arrive at an average numerical weight; and
    means for decoding said average numerical weight to deterine its letter grade equivalent and for displaying said letter grade equivalent on said letter grade display section.

2. The apparatus as set forth in claim 1 wherein said grading system includes "plus" and "minus" signs, there being a separate grade key for each grade in the system, and wherein said letter grade display section also includes a plus-minus display.

3. The apparatus as set forth in claim 2 wherein said decoding means includes means for rounding said average numerical weight off to the nearest letter grade in said system.

4. The apparatus as set forth in claim 1 wherein at least some of said numerical weights exceed 9 and which further comprises means for generating numerical weights requiring double digits through a single key.

5. The apparatus as set forth in claim 1 wherein said keys also bear as a label a particular number and which is also capable of functioning as a conventional digit calculator.

6. The apparatus as set forth in claim 5 which further comprises means for switching from the grade averaging to the conventional calculator mode, said means deactivating said letter grade and number of inputs sections.

7. The apparatus as set forth in claim 5 wherein the number a particular key bears corresponds to the predetermined numerical weight of the letter grade which that key bears.

8. The apparatus as set forth in claim 5 which is also capable of functioning as a conventional digital calculator.

9. The apparatus as set forth in claim 1 which further comprises means for displaying said average numerical weight on said numerical weight section.

10. A digital calculator apparatus for use by teachers for averaging a sequence of grades in a particular grading system, each grade of the system having a predetermined numerical weight, at least some of said numerical weights being expressed in terms of double digit numbers, said apparatus comprising:
    a keyboard having a plurality of manually operable keys, each key bearing as a label a particular grade in said particular system;
    digital display means including a numerical weight display section and a number of inputs section;
    means for activating said display means such that when a particular grade key is actuated the numerical weight assigned that particular grade is displayed on said numerical weight display section and the cumulative number of grade keys which have been actuated in that particular sequence is displayed on said number of inputs section;
    means for summing all the numerical weights relating to a particular sequence of grades;
    means for dividing such sum by the number of grades in the sequence to arrive at the average numerical weight; and
    digital display means for displaying said average numerical weight.

11. The apparatus as set forth in claim 10 wherein said particular grading system includes the fourteen letter grades E through A+, wherein there is a key for each of said fourteen letter grades, and wherein the grades of B+ through A+ are assigned numerical weights equivalent to 10 through 13, respectively.

12. The apparatus as set forth in claim 11 wherein each of said keys bears a label indicating both a letter grade and its numerical weight.

13. The apparatus as set forth in claim 12 wherein said digital display means includes a letter grade display section and which further comprises means for activating said display means such that when a particular grade key is actuated the particulr letter grade of that key is displayed on said letter grade display section; and,
    means for decoding said average numerical weight to determine its letter grade equivalent and for displaying said letter grade equivalent on said letter grade display section.

14. The apparatus as set forth in claim 11 which further comprises means for decoding said average numerical weight to determine its letter grade equivalent and means for displaying said letter grade equivalent.

15. The apparatus as set forth in claim 14 wherein said decoding means includes means for rounding said average numerical weight off to the nearest letter grade in said system.

16. The apparatus as set forth in claim 10 wherein said generating means associated with those keys bearing a grade having a double digit numerical weight generates one digit when the key is depressed and the other digit when the key is released.

* * * * *

UNITED STATES PATENT AND TRADEMARK OFFICE
CERTIFICATE OF CORRECTION

PATENT NO. : 4,048,484
DATED : September 13, 1977
INVENTOR(S) : John L. Brittan

It is certified that error appears in the above—identified patent and that said Letters Patent are hereby corrected as shown below:

```
Column 1, line 5:
    "The" should be -- This --;
Column 1, line 7:
    "to" (second occurrence) should be -- of --;
Column 1, line 58:
    after "tally" insert -- being --;
Column 2, line 13:
    after "digital" insert -- display --;
Column 3, line 13:
    ",13" should be -- 13, --;
Column 3, line 17:
    "disigned" should be -- designed --;
Column 4, line 44:
    "discribed" should be -- described --;
Column 4, line 53:
    "given" should be -- give --;
Column 5, line 26:
    after "time" insert -- this --;
Column 6, line 20:
    "If" should be -- It --;
```

UNITED STATES PATENT AND TRADEMARK OFFICE
CERTIFICATE OF CORRECTION

PATENT NO. : 4,048,484

DATED : September 13, 1977

INVENTOR(S) : John L. Brittan

It is certified that error appears in the above-identified patent and that said Letters Patent are hereby corrected as shown below:

Column 6, line 39:
    "signal" should be -- sign --;
Column 7, line 3:
    "key" should be -- keys --;
Column 7, line 38:
    "signal" should be -- digital --;
Column 8, line 63:
    "particulr" should be -- particular --.

Signed and Sealed this

Seventh Day of March 1978

[SEAL]

Attest:

RUTH C. MASON
Attesting Officer

LUTRELLE F. PARKER
Acting Commissioner of Patents and Trademarks